United States Patent [19]
Rodriguez et al.

[11] Patent Number: 5,870,287
[45] Date of Patent: Feb. 9, 1999

[54] SPRING CLIP FOR MOUNTING A HEAT SINK TO AN ELECTRONIC COMPONENT

[75] Inventors: Raul M. Rodriguez, Manchester; John R. Cennamo, Gilford, both of N.H.

[73] Assignee: Aavid Thermal Technologies, Inc., Laconia, N.H.

[21] Appl. No.: 946,459

[22] Filed: Oct. 7, 1997

Related U.S. Application Data

[60] Provisional application No. 60/036,734 filed Jan. 24, 1997.
[51] Int. Cl.⁶ ...................................................... H05K 7/20
[52] U.S. Cl. .......................... 361/704; 361/707; 361/709; 361/710; 361/717; 361/718; 361/719; 257/718; 257/719; 257/726; 257/727; 165/80.2; 165/80.3
[58] Field of Search ..................................... 361/704, 717, 361/707, 709, 710, 715, 718, 722; 257/718, 719, 722, 727; 165/80.3; 174/16.3

[56] References Cited

U.S. PATENT DOCUMENTS

| | | | |
|---|---|---|---|
| 5,526,874 | 6/1996 | White | 361/704 |
| 5,638,258 | 6/1997 | Lin | 361/704 |
| 5,684,676 | 11/1997 | Lin | 361/704 |

*Primary Examiner*—Leo P. Picard
*Assistant Examiner*—Boris L. Chervinsky
*Attorney, Agent, or Firm*—Cohen, Pontani, Lieberman & Pavane

[57] ABSTRACT

A heat sink spring clip having a linearly displaceable deflection member that operatively engages a biasing member for thermally and mechanically connecting a heat sink to an electronic component. The deflection member is moveable in a generally linear manner on and relative to the biasing member between a first position of nonengagement in which the biasing member is substantially undeflected and a second position in which the biasing member is deflected and the deflection member is contactingly and operatively engaged with the heat sink for thermally and mechanically connecting the heat sink to an electronic component. As the deflection member is moved from the disengaged position to the engaged position, complementary elements on the biasing member and deflection member engage one another and cause portions of the deflection and biasing members to move relatively apart. As the biasing member deflects in one direction generally away from the heat sink, the biasing member simultaneously imparts a generally oppositely directed compression force onto the heat sink and electrical components adjacently stacked therebeneath through the deflection member. The deflection member is operatively moveable in a generally horizontal direction longitudinally on and along the biasing member or, in an alternate embodiment, in a direction substantially transverse to the elongation of the biasing member.

26 Claims, 10 Drawing Sheets

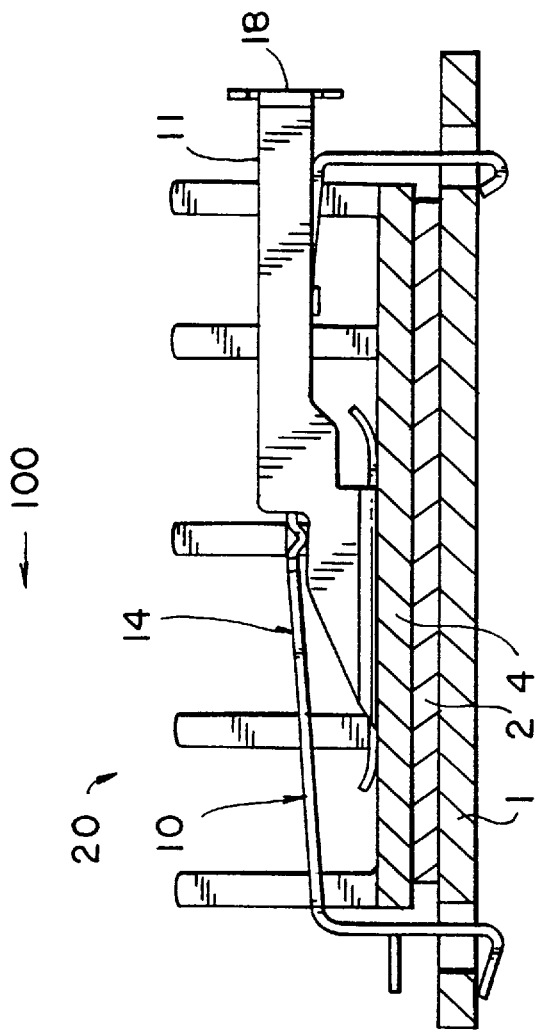

SPRING CLIP FOR MOUNTING A HEAT SINK TO AN ELECTRONIC COMPONENT

CROSS-REFERENCE TO RELATED APPLICATION

The present application claims priority from U.S. Provisional Patent Application Ser. No. 60/036,734 which was filed on Jan. 24, 1997.

BACKGROUND OF THE INVENTION

1. Field of the Invention

The present invention relates to spring clips and, more particularly, to a low insertion force spring clip for thermally and mechanically mounting a heat sink to an electronic component.

2. Description of the Related Art

Electronic components on circuit boards such as, for example, power transistors and microprocessors, can generate significant amounts of heat which must be dissipated for the components to operate reliably. Some of the heat generated by the electronic components can be dissipated by the circuit board via the component's leads. Much of the excess heat, however, must be channeled to the ambient air by a separate heat sink thermally connected to the electronic component.

Traditionally, heat sinks were mounted to electronic components by passing bolts through holes in both the heat sink and component and securing the bolts with separate nuts. In other configurations, heat sinks have included tapped holes or pressed-in threaded fasteners to accommodate mounting by separate bolts. However, these configurations disadvantageously require that the electronic component have a mounting hole to accommodate the fastener.

A heat sink may also be mounted to an electronic component by a releasable leaf-spring type spring clip. Clips of this type attach to bosses projecting from opposite sides of the component or of a socket within which the electronic component is secured. A portion of the clip crossing over the heat sink bears down onto the top of the heat sink, applying a compressive force to the heat sink. However, the substantial forces required to install or remove such clips often results in damage to the circuit boards on which the components are mounted during installation and removal of the clip. For example, the high downward forces applied to the clips during installation and removal may cause the ends of the clips to contact and damage circuit paths or traces on the circuit boards. Furthermore, spring clips of this type typically require tools for installation and/or removal and the tools may either flex or strike the circuit board and cause damage, especially if the tool is misused or if an improper substitute tool is used. In addition, the need for a tool for installation or removal of a clip is undesirable, notwithstanding the risk of board damage.

SUMMARY OF THE INVENTION

The present invention advantageously overcomes the above-described shortcomings of the prior art. In accordance with the invention, a two-element heat sink spring clip includes a linearly displaceable deflection member that operatively engages a biasing member to thermally and mechanically connect a heat sink to an electronic component. The inventive spring clip reduces the risk of damage to the circuit board or other proximately located components and eliminates the need for tools and fasteners to install and remove the clip.

The biasing member of the present invention is configured as an elongated, elastically deformable strip or bar having mating tabs extending from the approximate longitudinal mid-point thereof. Legs are defined at opposite longitudinal ends of the biasing member, each terminating at a clip for removably attaching the spring clip to a heat sink, mounting plate, electronic component, etc. Alternatively, a pin having a generally conical end may be provided at the end of each leg for securing the inventive spring clip in place. The legs are preferably integral to the biasing member, although they may alternatively comprise features separate therefrom.

The inventive spring clip additionally comprises a deflection member that is selectively moveable in a generally linear direction relative to the biasing member between a first position of nonengagement with the heat sink in which the biasing member is substantially undeflected and a second position in which the biasing member is deflected and the deflection member is contactingly and operatively engaged with the heat sink for thermally and mechanically connecting the heat sink to an electronic component. In a first embodiment, the deflection member is moveable in a generally horizontal direction longitudinally on and along the biasing member. In a second embodiment, the deflection member is moveable in a direction that is substantially transverse to the biasing member longitudinal axis. As the deflection member is selectively moved from the disengaged position to the engaged position, an incline provided on the deflection member contactingly and operatively engages a complementary portion on the biasing member such that the complementary portion rides on and along the incline, causing the biasing member to deflect in a direction generally away from the heat sink which, in turn, effects a generally oppositely-directed compression force through the substantially planar bottom surface of the deflection member and onto the components stacked therebeneath. The complementary portion comprises tabs defined on the biasing member for the first embodiment and the bottom surface of the biasing member for the second embodiment. The deflection member may be moved thusly until it locks together with the biasing member. A retainer defined approximately at the apex of the incline provides a positive locking indication and prevents unintended disengagement of the biasing and deflection members. In the first embodiment, a generally horizontal linear movement of the deflection member effects the above-described engagement between the incline and mating tabs and the resulting compression of the stacked components. In the second embodiment, a generally rotational movement causes a generally linear vertical displacement of the deflection member to effect compression of the components.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, which are illustrative and not to scale, and wherein like reference numerals denote similar elements throughout the several views:

FIG. 6 is a cross-sectional side view of the electronic assembly of FIG. 5 with the spring clip in an engaged position;

DETAILED DESCRIPTION OF THE PRESENTLY PREFERRED EMBODIMENTS

The present invention provides a novel and unobvious device for thermally and removably connecting a heat sink to an electronic component. In accordance with the present invention, a heat sink spring clip includes a linearly displaceable deflection member that operatively engages a biasing member for thermally and mechanically connecting a heat sink to an electronic component. The deflection member is moveable in a generally linear manner between a first position of nonengagement in which the biasing member is substantially undeflected and a second position in which the biasing member is deflected and the deflection member is contactingly and operatively engaged with the heat sink for thermally and mechanically connecting the heat sink to an electronic component. As the deflection member is moved from the disengaged position to the engaged position, complementary elements on the biasing member and deflection member contactingly engage and cause opposed portions of the deflection and biasing members to move relatively apart. As the biasing member deflects in direction generally away from the heat sink, the biasing member simultaneously imparts a generally oppositely-directed compression force onto the heat sink and electrical or electronic components adjacently stacked therebeneath through the deflection member. In a first embodiment of the present invention, the deflection member is moved in a generally horizontal direction on and longitudinally along the biasing member. In an alternative embodiment, the deflection member is moved in a direction substantially transverse to the elongation of the biasing member. The inventive spring clip is thus operable to thermally secure an electronic assembly that may for example consist of a heat sink, an electronic component, a mounting plate, a socket within which the electronic component is securable, and a circuit board assembly. It will be obvious to a person skilled in the art that more or fewer components may form the electronic assembly and that the components may be stacked in a number of ways to provide thermal conductivity between the heat sink and the electronic component—the particular electronic assembly described herein being merely an illustrative non-limiting example. The terms clip and clamp are used interchangeably herein and are intended to broadly refer to devices that thermally connect, either directly or indirectly, a heat sink to an electronic component.

Figure 1:
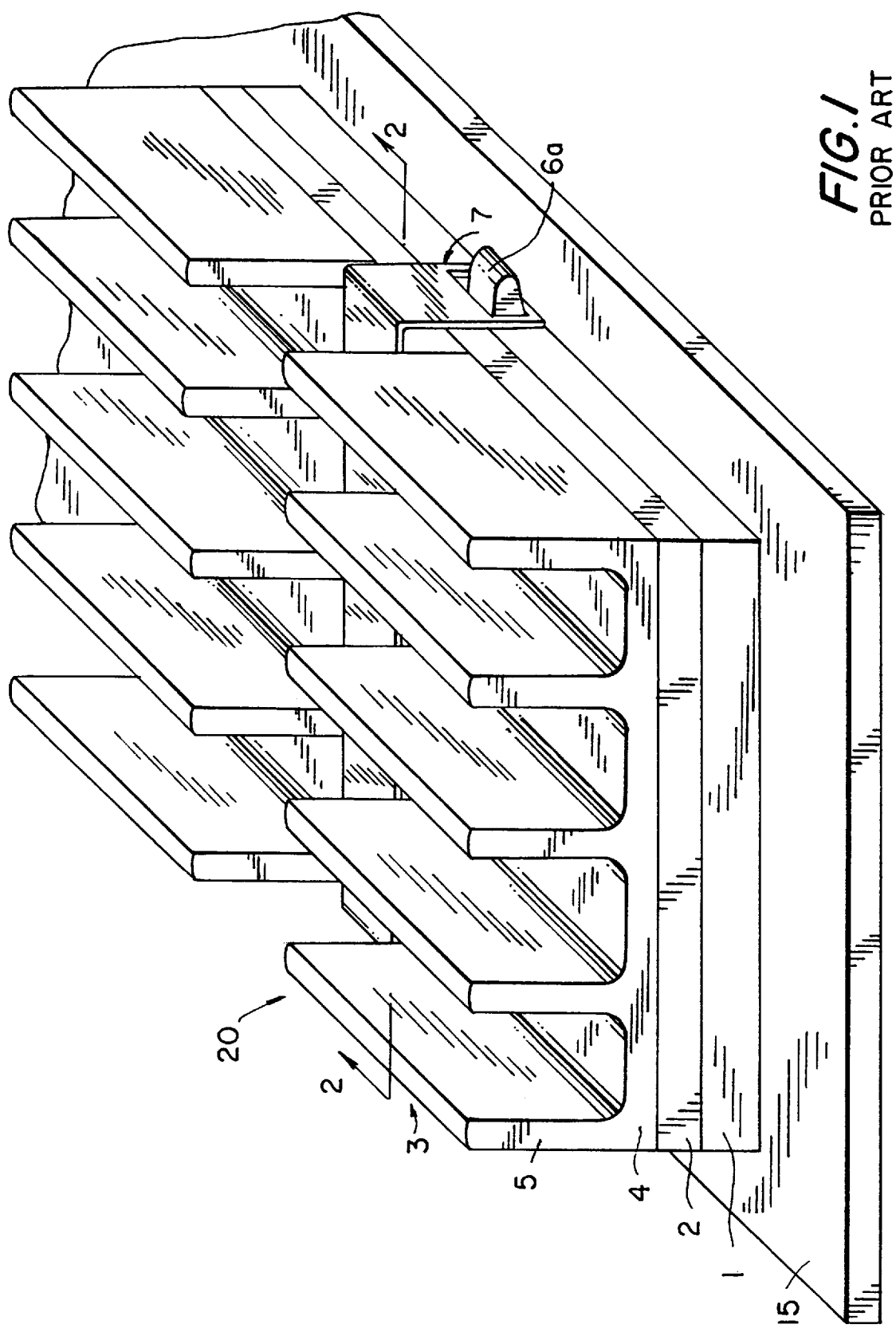
FIG. 1 is an isometric view of an electronic assembly utilizing a prior art heat sink clip.
Figure 2:
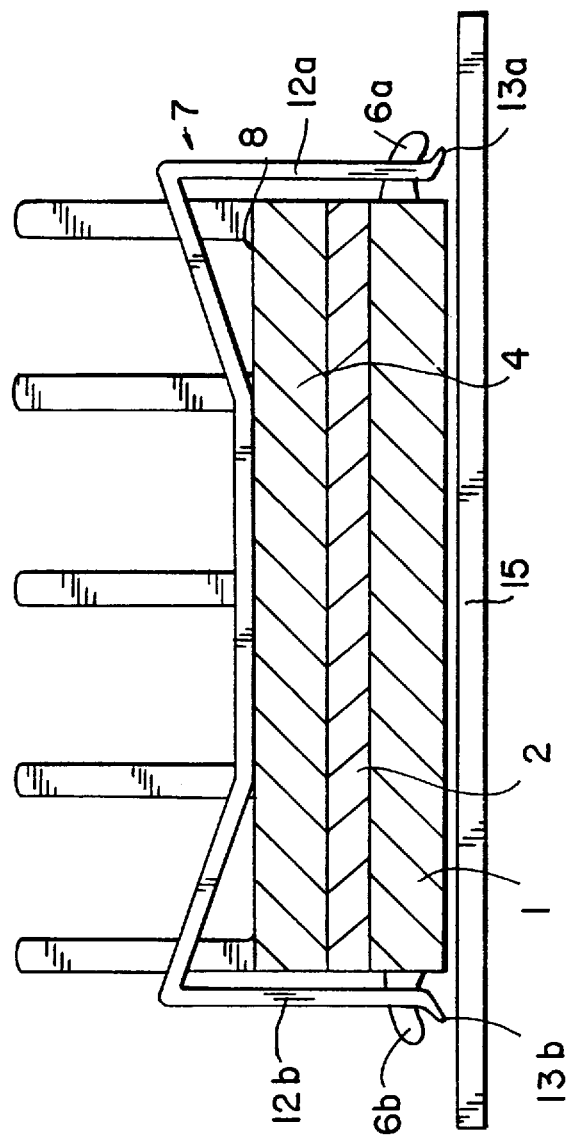
FIG. 2 is a cross-sectional side view taken along line A—A of FIG. 1.

Referring now to the drawings in detail, FIGS. 1 and 2 depict a prior art heat sink clip 7 connected to an electronic assembly 20. The electronic assembly 20 includes a circuit board 15, a socket 1 soldered or otherwise mounted to the circuit board 15, an electronic component 2 mounted in the socket 1, and a heat sink 3 having fins 5, a base 4 and an upper surface 8 (FIG. 2). The heat sink 3 is secured to the component 2 by the conventional spring clip 7 that attaches to bosses 6a, 6b extending from opposite sides of the socket 1. The spring clip 7 exerts a generally downwardly directed force on the upper surface 8 of the heat sink 3 to thermally and mechanically connect the heat sink 3 and electronic component 2. To install this spring clip 7, a user attaches a free end 13a of leg 12a of the spring clip 7 to the boss 6a and applies a downward force on the spring clip 7 until free end 13b of leg 12b engages the boss 6b located on the other side of socket 1. As shown more clearly in FIG. 2, ends 13a and 13b of legs 12a and 12b are only slightly spaced apart from the circuit board 15 when the spring clip 7 is installed. This short distance between ends 13a, 13b and circuit board 15, coupled with the high downward forces required to engage and disengage ends 13a, 13b to or from bosses 6a, 6b, creates an appreciable danger that the spring clamp 7 may unintentionally damage the circuit board 15 during its installation and/or removal.

Figure 3:
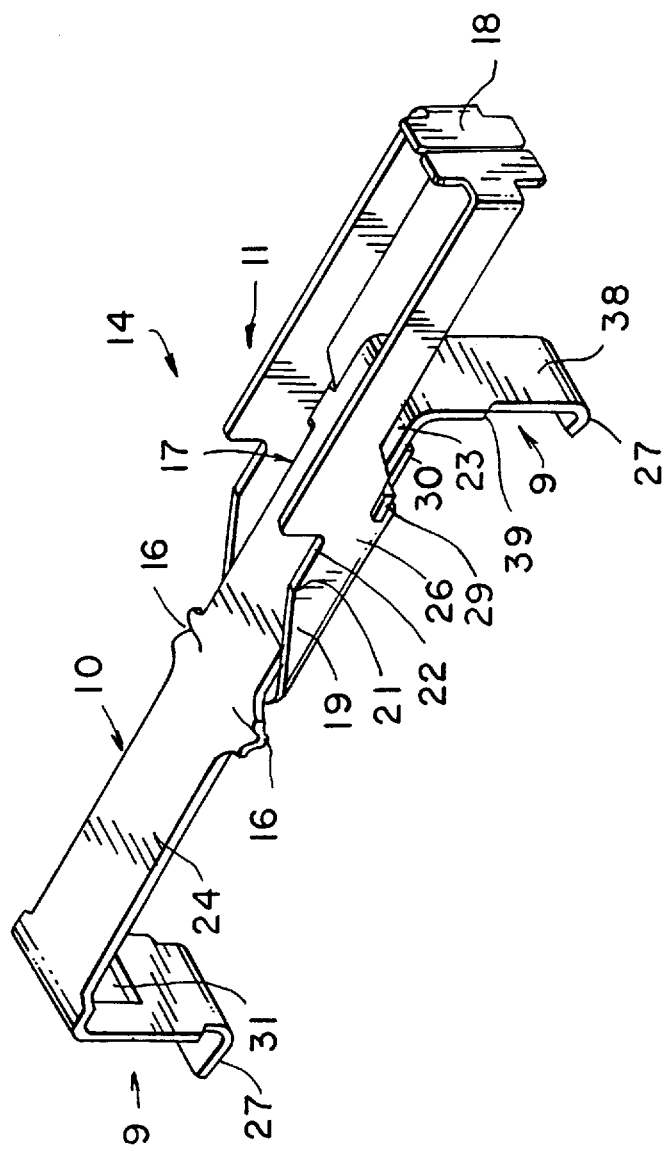
FIG. 3 is an isometric view of a spring clip configured in accordance with the present invention.
Figure 4:
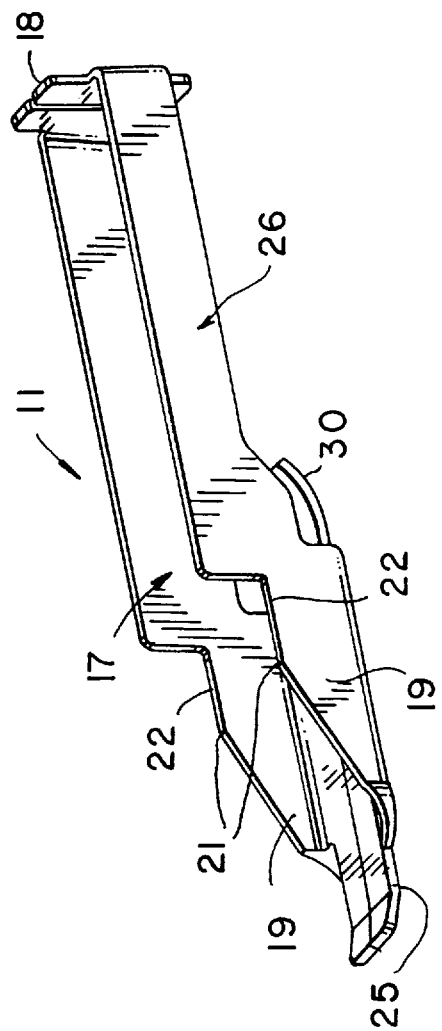
FIG. 4 is an isometric view of the deflection member of the spring clip of FIG. 3.

Referring next to FIGS. 3 and 4, a preferred embodiment of a spring clip 14 constructed in accordance with the present invention is there depicted. The inventive spring clip 14 comprises a biasing member 10 configured as a substantially planar strip or bar formed of elastically deformable material and having longitudinally oppositely disposed first and second ends 23, 24. The biasing member 10 is preferably formed from metal, although it may alternatively be fabricated from plastic or other similar elastically deformable materials. Tabs 29 are defined near first end 23 of biasing member 10 and extend laterally outward therefrom. Mating tabs 16 extend laterally outward from the approximate longitudinal mid-point between the first and second ends 23, 24 and are configured to engagingly mate with complementary features on a deflection member 11.

Legs 9 defined at both the first and second ends 23, 24 of biasing member 10 extend in a generally downward and substantially perpendicular direction therefrom. In a preferred embodiment, the legs 9 include clips or tab-like anchors 27 extending generally perpendicular to the ends of legs 9 remote from the first and second ends 23, 24 of the biasing member 10. The anchors 27 secure the inventive spring clip 14 in place when deflection member 11 is in the engaged position (as described in further detail below). The leg 9 located proximate first end 23 includes a narrowed bottom portion 38 that defines a transition 39—the transition 39 and bottom portion 38 being sized and shaped so as to present the inventive spring clip 14 at a predetermined displacement from a heat sink 3 when the inventive clip 14 is installed and in an engaged state. A tab 31 may be defined in the leg 9 located proximate the second end 24 of biasing member 10 to similarly position and orient the spring clip 14 with respect to the heat sink 3. The transition 39 and tab 31 prevent the ends of the legs 9 from extending too far below the socket 1 and unintentionally contacting components, e.g. the circuit board 15, other electronic devices, etc., located therebelow (see, for example, FIG. 5). Thus, the transition 39 and tab 31 carried on the legs 9 prevent undesired contact between the inventive spring clip 14 and other proximately located components and thereby reduce the risk of damage to such other components. The legs 9 are preferably unitarily formed integral with the biasing member 10, although other embodiments of the present invention may alternatively comprise integral legs 9 and separate anchors 27, or separate legs 9 and anchors 27, by way of example.

Referring next to FIG. 4, deflection member 11 includes a substantially planar bottom surface 25 that may be brought into abuttingly contacting relation with the heat sink 3. Inclines 19 are provided on the deflection member 11 and define a generally ramped or inclined plane along which the mating tabs 16 travel as the deflection member 11 is selectively moved on and longitudinally along the biasing member 10 between the disengaged and engaged positions. Retainers 21 defined approximately at an apex of the inclines 19 provide a positive locking state or indication between the biasing member 10 and deflection member 11 and are configured to prevent unintended disengagement of the biasing and deflection members 10, 11. When the deflection member 11 and biasing member 10 are operatively engaged, as depicted in FIG. 6, the mating tabs 16 rest on generally horizontally oriented spring seats 22. Deflection member 11 additionally includes a substantially hollow body 26 having an opening 17 defined therein and including an engagement tab 18 formed thereon. Selective linear movement of the deflection member 11 on and along biasing member 10 may be effected by manually imparting a motive force to engagement tab 18. A stabilizer 30 operates together with the tabs 29 to bias or hold deflection member 11 in a predetermined and substantially fixed position relative to the heat sink 3 when the inventive spring clip 14 is in an undeflected state, i.e. when the deflection member 11 is coupled with the biasing member 10 in the disengaged position (see, e.g., FIG. 3).

As shown in FIG. 3, deflection member 11 may be initially slidably attached to the first end 23 of biasing member 10 prior to installation of the spring clip 14. Deflection member 11 is selectively moveable on and along biasing member 10 in a generally horizontal linear direction—such linear movement being arrested in one direction by tabs 29 of biasing member 10 and in the other direction by engagement between details 16 and spring seats 22.

Figure 5:
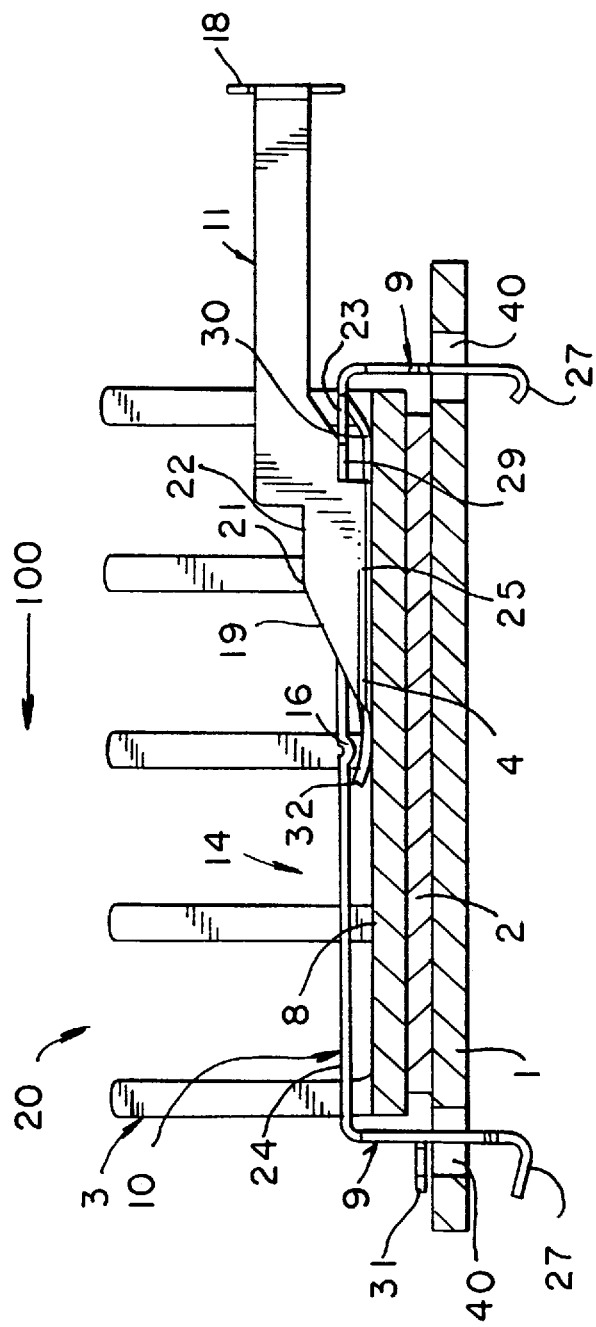
FIG. 5 is a cross-sectional side view of an electronic assembly utilizing the spring clip of FIG. 3 with the spring clip in a disengaged position.
Figure 5A:
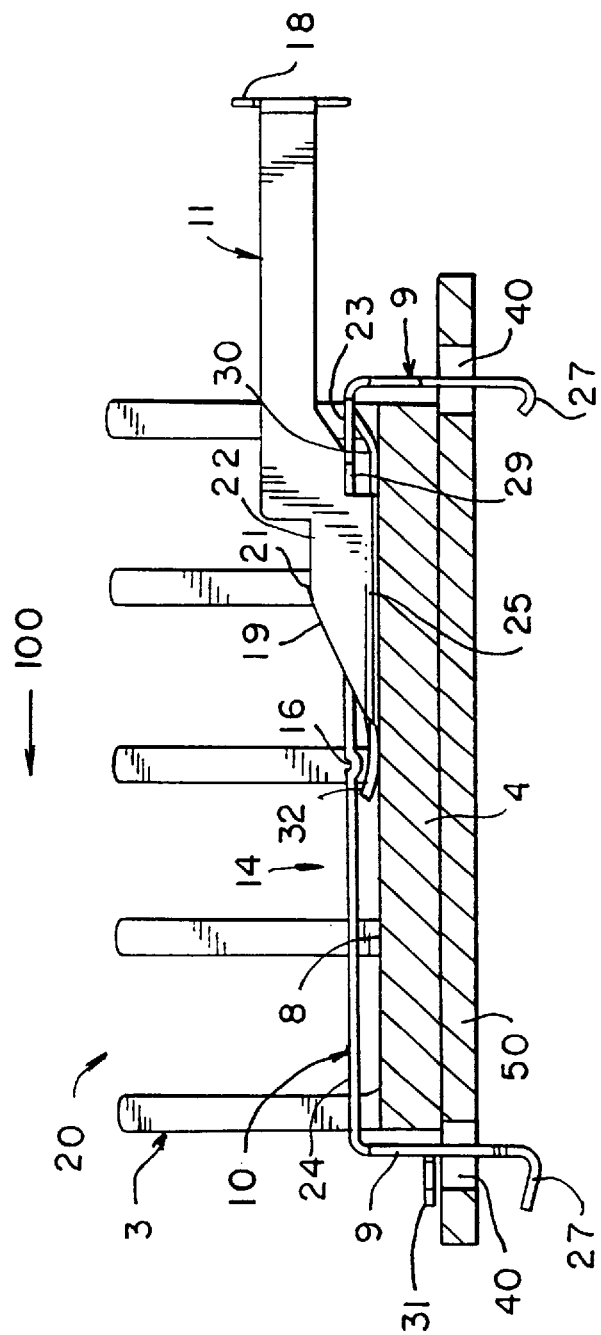
FIG. 5A is a cross-sectional side view of an electronic assembly utilizing the spring clip of FIG. 3 mounted directly to a mounting plate and in the disengaged position.

Referring next to FIGS. 5 and 6, wherein the inventive spring clip 14 is depicted in the disengaged and engaged positions, respectively, the operation of the illustrated preferred embodiment will now be described. The inventive spring clip 14 is depicted in FIG. 5 in a disengaged position in which the biasing member 10 is substantially undeflected and parallel with the components positioned or stacked therebeneath. The particular electronic assembly 20 shown in FIG. 5 includes a component socket 1 having apertures 40 defined therethrough, an electronic component 2 and a heat sink 3. Although the assembly 20 of FIG. 5 depicts an electronic component 2 sandwiched between the socket 1 and heat sink 3, the electronic component 2 need not lie directly beneath the heat sink 3 and in direct contact therewith, i.e. the heat sink 3 may alternatively, by way of example, be clamped to a mounting plate 50 which is then thermally connected to the electronic component 2, as shown in FIG. 5A. Furthermore, it will be obvious to a person skilled in the art that the assembly 20 may also comprise components different from those described in the present illustrative example, such different components also being positionable or stackable in various relationally different ways limited only by the imagination of a routineer in the art.

When deflection member 11 and biasing member 10 are not operatively engaged for clamping an electronic assembly, i.e. when deflection member 11 is in the first or disengaged position as depicted in FIG. 5, biasing member 10 is undeflected and lies substantially parallel to, and normally at a predetermined distance from, the upper surface 8 of the heat sink 3—the predetermined distance being controlled in the illustrated embodiment by the tab 31 and the transition 39 (FIG. 3). Deflection member 11 is positioned proximate first end 23 of biasing member 10 such that bottom surface 25 rests on the upper surface 8 of the heat sink 3. In this disengaged position, deflection member 11 is held in place by stabilizer 30 and tabs 29 and is freely movable in a generally linear and horizontal direction on and along the first end 23 of biasing member 10, as indicated by arrow 100. The spring clip 14 may be selectively engaged with the heat sink 3 by moving the deflection member 11 from the first position to the second or engaged position to thermally and mechanically compress the electronic assembly 20. Exerting a motive force on engagement tab 18 in a direction substantially parallel to the plane of the undeflected biasing member 10, as indicated by arrow 100, will cause deflection member 11 to slide on and along the first end 23 of biasing member 10 until the inclines 19 contact or engage the complementary mating tabs 16. As additional force is then applied to deflection member 11 via engagement tab 18, biasing member 10 is caused to be displaced in a generally upward direction until anchors 27 contact the socket 1—at which point further upward displacement of biasing member 10 is prevented. Thereafter, and with continued motive force applied to engagement tab 18, mating tabs 16 slide up and along inclines 19 and over the retainers 21 until mating tabs 16 come to rest in the spring seats 22, effectively causing biasing member 10 to deflect direction generally away from the heat sink (upward in the drawings) as shown in FIG. 6.

As seen in FIG. 6, the upward deflection of biasing member 10 imparts a generally downward force, i.e. in a direction opposite that which biasing member 10 is deflected, to deflection member 11 which causes the bottom surface 25 of deflection member 11 to abuttingly contact the heat sink 3, thereby compressing and thermally connecting the various components of the electronic assembly 20. The upward deflection of biasing member 10 also imparts a generally upward force on the anchors 27, thereby limiting the upward displacement of legs 9. Retainers 21 on deflection member 11 provide a barrier over which the mating tabs 16 of biasing member 10 must pass to disengage biasing and deflection members 10, 11—i.e. to move deflection member 11 from the engaged to the disengaged position. Thus, retainers 21 prevent unintended disengagement of biasing member 10 and deflection member 11 due to vibration and the like. Nevertheless, disengagement of the biasing and deflection members 10, 11 may be accomplished by applying a force to engagement tab 18 in a direction opposite that indicated by arrow 100 and of sufficient magnitude to cause the mating tabs 16 to overcome and pass the retainers 21.

Deflection member 11 and biasing member 10 are preferably formed from metal and may include a lubricant, such for example as, Teflon®, added to one or both of the mating surfaces of the biasing and deflection members 10, 11—e.g. mating tabs 16, inclines 19 and spring seats 22—to assist the sliding movement of the various complementary mating surfaces. Alternatively, deflection member 11 and/or biasing member 10 may be formed from a nonmetallic material having a low coefficient of friction, e.g. graphite-laced plastic, which provides advantages similar to those obtained by using lubricants with metallic embodiments. It will be obvious to a person skilled in the art that the choice of materials and/or lubricants for the various components is a routine matter of design choice.

Figure 7:
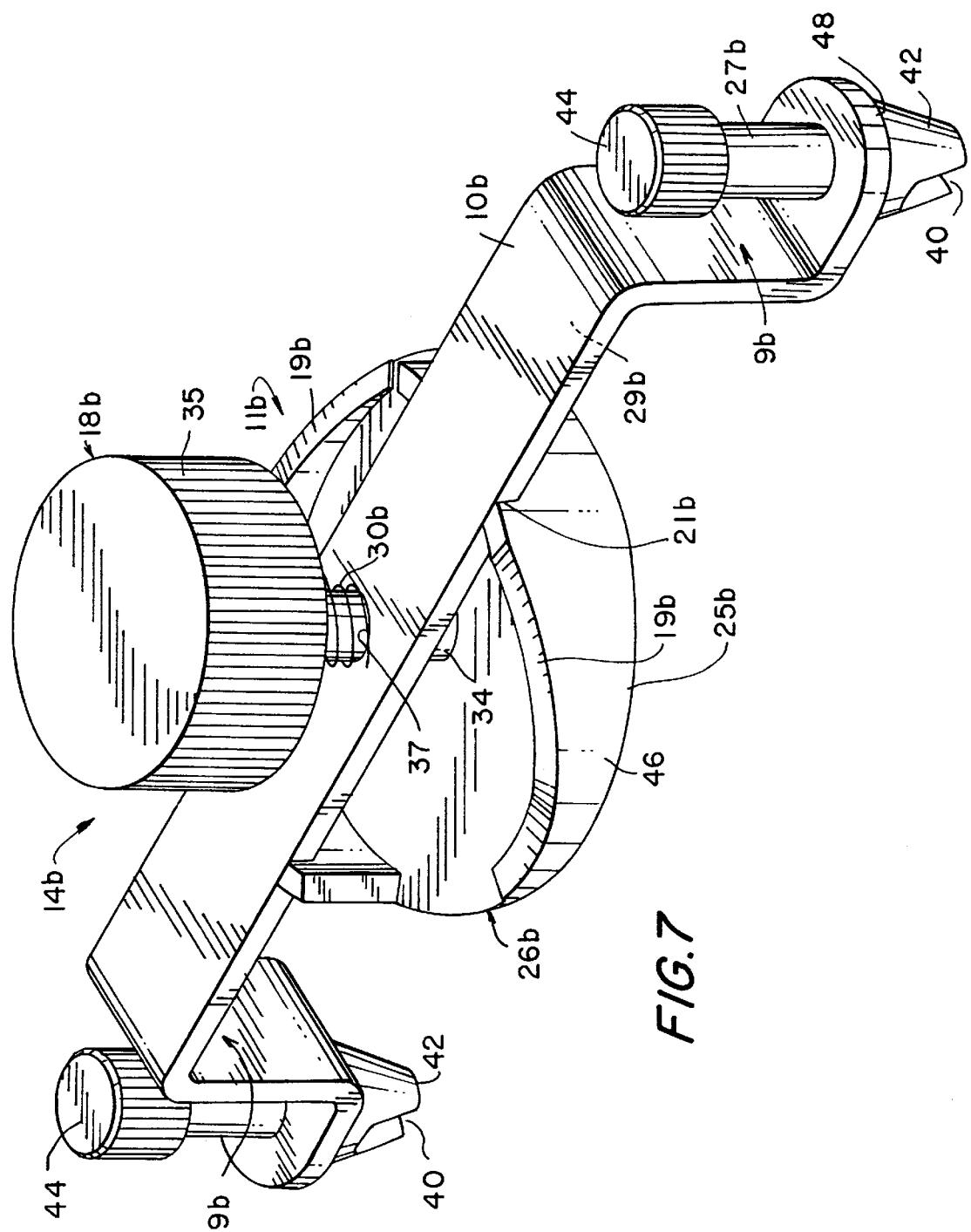
FIG. 7 is an isometric view of an alternative embodiment of a spring clip configured in accordance with the present invention.
Figure 8:
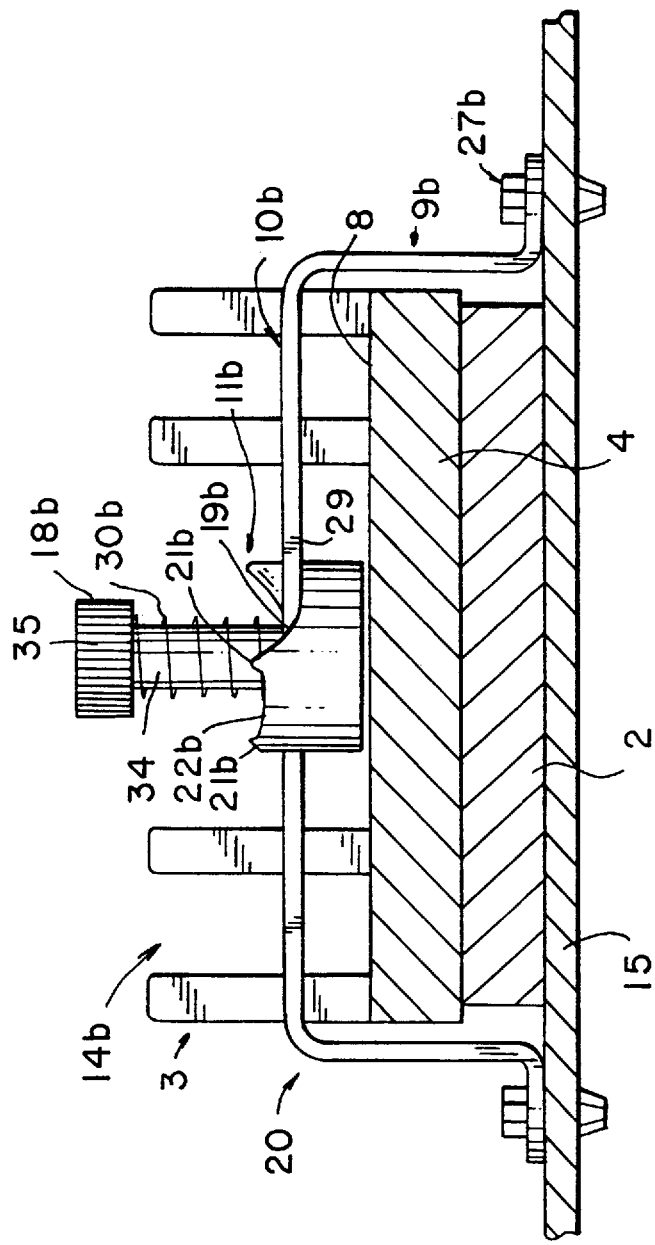
FIG. 8 is a cross-sectional side view of an electronic assembly utilizing the spring clip of FIG. 7 with the spring clip in a disengaged position.
Figure 9:
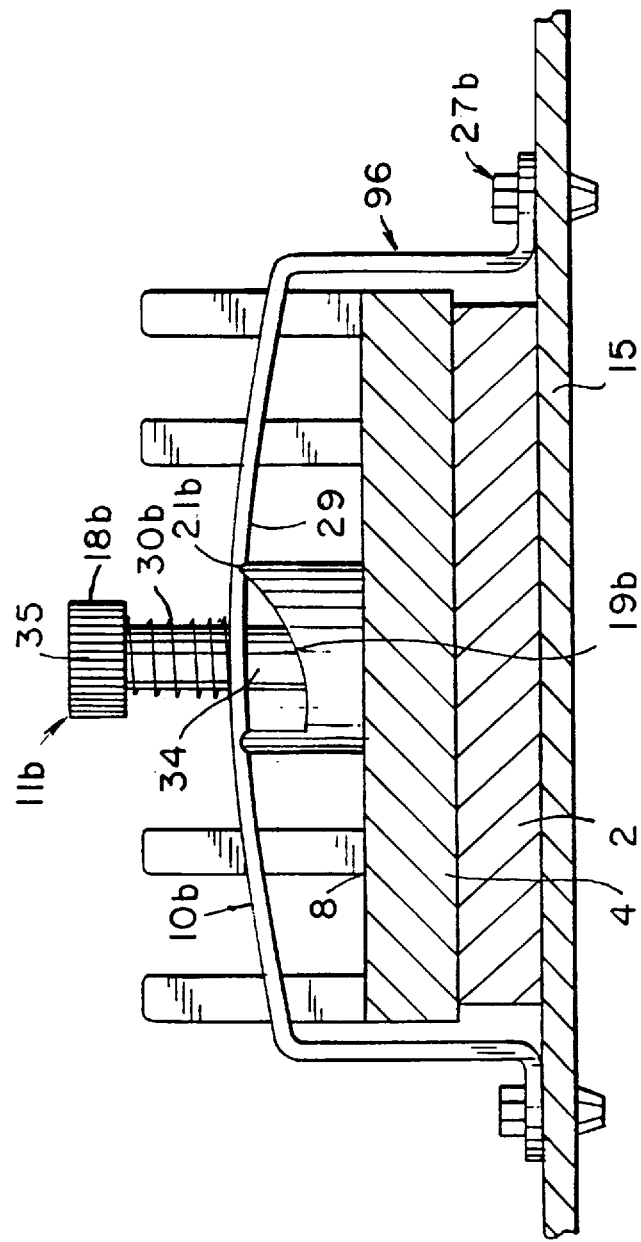
FIG. 9 is a cross-sectional side view of the electronic assembly of FIG. 8 with the spring clip in an engaged position.

Referring next to FIGS. 7, 8 and 9, an alternative embodiment of the present invention is depicted in which changes of the state of engagement between biasing and deflection members 10, 11 is achieved by a generally vertically directed linear movement (in the drawings) of a deflection member 11b. The biasing member 10b of this second embodiment is configured as a substantially planar strip or bar having a bottom surface 29b and a longitudinally central and generally circular aperture 37 defined therethrough. Legs 9b are defined on opposite longitudinal ends of biasing member 10b and extend generally downward therefrom and substantially perpendicular thereto. Anchors 27b are carried at the free ends of legs 9b and may comprise pins having a substantially conically shaped end 42 having a channel 40 defined therethrough. The conically shaped end 42 is sized and shaped to pass through a hole or aperture provided in a printed circuit board 15, mounting plate (not shown), electronic component 2, etc., and to secure the spring clip 14b in place. A shoulder 48 defined on the conical end 42 prevents unintended and unassisted release of the anchors 27b. A head 44 is provided on an end of anchors 27b opposite the conically shaped end 42.

With continued reference to FIG. 7, the deflection member 11b of this alternative embodiment includes an engagement member 18b configured as a cylindrical shaft 34 having an enlarged cylindrical knob 35 affixed thereto. The deflection member 11b further comprises a substantially cylindrical body 26b affixed to the shaft 34 at an end opposite the knob 35. The shaft 34 freely passes through the aperture 37 defined in biasing member 10b so as to permit selective displacement of deflection member 11b in a direction generally transverse to the biasing member longitudinal axis (generally vertical in the drawings). Engagement member 18b further comprises a stabilizer 30b preferably configured as a coil spring to bias deflection member 11b in a generally away from the heat sink 3 (upward in FIGS. 7, 8 and 9). It will be obvious to a person skilled in the art that other means may alternatively provide the desired upward biasing of deflection member 11b. The cylindrical body 26b includes a substantially planar bottom surface 25b and non-continuous peripheral walls 46 extending in a generally upward direction therefrom. The peripheral walls 46 terminate at inclines 19b having retainers 21b defined approximately at the apex of inclines 19b and configured to prevent unintentional disengagement of biasing member 10b from deflection member 11b (as described in further detail hereinbelow). The peripheral walls 46 also include generally horizontally disposed spring seats 22b upon which bottom surface 29b of biasing member 10b rests when the deflection member 11b is in the engaged position. The deflection member 11b is selectively moveable between a first position of nonengagement, in which the biasing member 10b is substantially undeflected and a second position in which the biasing member 10b is deflected and the deflection member 11b is contactingly and operatively engaged with the heat sink for thermally and mechanically connecting the heat sink to an electronic component. Such selective movement of the deflection member 11b is in a direction that is substantially transverse to the biasing member longitudinal axis (vertical in the drawings) and may be effected by imparting rotational movement to the knob 35 of engagement member 18b of sufficient magnitude and duration to cause the bottom surface 25b of biasing member 10b to ride on and along the inclines 19b and ultimately overcome retainers 21b.

Referring next to FIGS. 8 and 9, operation of the alternative embodiment of FIG. 7 will now be described. The spring clip 14b is shown in its disengaged state or position in FIG. 8, where the deflection member 11b is in a first, disengaged position and the biasing member 10b is substantially horizontal and undeflected and is secured to the circuit board 15 by the pins 27b. Thus, in this disengaged state, biasing member 10b is positioned so that its bottom surface 29b contacts the low point of inclines 19b and the bottom surface 25b of deflection member 11b is maintained in spaced-apart relation to the heat sink 3 by stabilizer 30b. It will be obvious to a person skilled in the art that the bottom surface 25b of biasing member 10b may also abuttingly contact the heat sink 3 without imparting a compression force thereto when the deflection member 11b is in the disengaged first position. The spring clip 14b may be selectively engaged, i.e. the deflection member 11b selectively moved from the disengaged to the engaged position, by exerting a rotational force on the engagement member 18b via the cylindrical knob 35 so that the bottom surface 29b of biasing member 10b slides along and up the inclines 19b. The rotational force must be sufficiently great to overcome the retainers 21b—with the bottom surface 29b of deflection member 11b coming to rest in spring seats 22b. When disposed in the engaged position depicted in FIG. 9, biasing member 10b is thus deflected in a generally upward direction, imparting a generally downwardly-directed compression force onto deflection member 11b and mechanically and thermally connecting the various component of the electronic assembly 20.

While the aforedescribed embodiments have been directed to specific relational configurations of an electronic assembly 20, it will be obvious to a person skilled in the art that various other electronic assembly configurations may also be employed with the inventive spring clip, its use with such other assembly configurations being expressly contemplated by the present invention.

The present invention thus provides a spring clip for mounting a heat sink to an electronic component without the risk of damage to the associated circuit board or other proximately located components. In accordance with a preferred embodiment of the invention, the deflection member may be selectively moved in a generally horizontal and linear direction on and along the biasing member to cause the inventive spring clip to thermally and mechanically compress the components stacked therebeneath. In an alternative embodiment, the deflection member may be selectively moved in a generally vertical and linear direction relative to the biasing member to effect the desired thermal and mechanical compression of the adjacently stacked components.

Thus, while there have shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve substantially the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A heat sink retaining apparatus for thermally and mechanically coupling a heat sink to an electronic assembly including a device requiring assisted cooling, said apparatus comprising:

a deflectable biasing bar having a first end, a second end, and a longitudinal axis extending through said first and said second ends, said biasing bar including a mounting leg disposed at each of said first and said second ends, said mounting legs being configured for securing said retaining apparatus adjacent the heat sink; and a selectively moveable deflection member having a bottom surface disposed between said biasing bar and said heat sink, and an inclined surface for engaging a complementary feature on said biasing bar so that said complementary feature travels on and along said inclined surface as said deflection member is selectively moved between a first position of nonengagement wherein said biasing bar is substantially undeflected, and a second position wherein said biasing bar is deflected in a first direction for imparting a force on said deflection member in a direction generally opposite to said first direction so as to thermally couple the heat sink to the electronic assembly.

2. The retaining apparatus of claim 1, wherein said deflection member is selectively moveable between said first and said second positions substantially along said longitudinal axis of said biasing bar.

3. The retaining apparatus of claim 2, wherein said deflection member further comprises a retainer disposed on said at least one inclined surface to prevent unassisted movement of said deflection member from said second position to said first position.

4. The heat sink retaining apparatus of claim 1, wherein said complementary feature includes a mating tab extending laterally outward from said biasing bar.

5. The retaining apparatus of claim 1, further comprising:

a stabilizer disposed on said deflection member; and a tab extending generally outward from said biasing bar for operatively engaging said stabilizer and for holding said biasing bar and said deflection member together when said deflection member is in said first position.

6. The retaining apparatus of claim 3, wherein at least one of said biasing bar and said deflection member is coated with a friction reducing material.

7. The retaining apparatus of claim 3, wherein at least one of said biasing bar and said deflection member is formed of a plastic material having a low coefficient of friction.

8. The retaining apparatus of claim 3, wherein said complementary feature of said biasing bar is positioned approximately longitudinally centrally along said biasing bar.

9. The retaining apparatus of claim 1, wherein said mounting legs extend generally perpendicularly from each of said first and said second ends.

10. The retaining apparatus of claim 9, wherein said mounting legs are configured for releasable mounting to a support structure selected from a group of support structures consisting of a circuit board, the device requiring assisted cooling, a mounting plate, and a mounting socket for the device requiring cooling.

11. The retaining apparatus of claim 10, wherein each of said mounting legs further comprises a tab for preventing said retaining apparatus from contacting devices located proximate the support structure.

12. The retaining apparatus of claim 9, wherein each of said mounting legs has a free end and further comprises an anchor defined at said free end.

13. The retaining apparatus of claim 9, wherein said legs are integrally formed with said biasing bar.

14. The retaining apparatus of claim 1, wherein said deflection member is selectively moveable between said first and said second positions in a direction defined substantially transverse to said biasing bar longitudinal axis, said deflection member further comprising:

a substantially cylindrical body rotatably mounted along said longitudinal axis of said biasing bar and disposed between said biasing bar and the heat sink, said cylindrical body having a bottom surface moveable into abutting engagement with the heat sink;

a selectively rotatable member connected to said cylindrical body so that rotation of said rotatable member causes said deflection member to be selectively moved between said first and said second positions; and an inclined surface formed on said cylindrical body for engagement with a complementary portion of said biasing bar, said biasing bar complementary portion travelling on and along said inclined surface as said deflection member is selectively rotated and moved between said first and said second positions, said travel of said biasing bar complementary portion on and along said inclined surface when said deflection member is moved from said first to said second position causing deflection of said biasing bar in said first direction.

15. The retaining apparatus of claim 14, wherein said deflection member further comprises a retainer disposed on said at least one inclined surface to prevent unassisted movement of said deflection member from said second to said first position.

16. The retaining apparatus of claim 14, further comprising a biasing element for biasing said cylindrical body away from the heat sink when said deflection member and said biasing bar are not engaged.

17. The retaining apparatus of claim 16, wherein said biasing element comprises a coil spring located between said rotatable member and said biasing bar.

18. The retaining apparatus of claim 15, wherein at least one of said biasing bar and said deflection member is coated with a friction reducing material.

19. The retaining apparatus of claim 15, wherein at least one of said biasing bar and said deflection member is formed of a plastic material having a low coefficient of friction.

20. The retaining apparatus of claim 15, wherein said deflection member is mounted approximately longitudinally centrally along said biasing bar.

21. The retaining apparatus of claim 14, wherein said mounting legs extend generally perpendicularly from said each of said first and said second ends.

22. The retaining apparatus of claim 21, wherein said mounting legs are configured for releasable mounting to a support structure selected from a group of support structures consisting of a circuit board, the device requiring assisted cooling, a mounting plate, and a mounting socket for the device requiring cooling.

23. The retaining apparatus of claim 22, wherein said mounting legs each further comprises a pin sized and shaped to pass through an aperture defined in said support structure for mounting said mounting legs thereto.

24. The retaining apparatus of claim 21, wherein said legs are integrally formed with said biasing bar.

25. The heat sink retaining apparatus of claim 2, further comprising a tab configured to accommodate user-effected manipulation to selectively move said deflection member between said first and said second positions.

26. In combination:

a heat sink;

an electronic assembly including a device requiring assisted cooling and a circuit board; and a heat sink retaining apparatus for thermally and mechanically coupling said heat sink to said electronic assembly, said apparatus comprising:

a deflectable biasing bar having a first end, a second end, a longitudinal axis extending through said first and said second ends, and a complementary feature, said biasing bar including a mounting leg disposed at each of said first and said second ends and configured for securing said retaining apparatus adjacent the heat sink; and a selectively moveable deflection member having a bottom surface disposed between the biasing bar and the heat sink and an inclined surface configured to engage said complementary feature on said biasing bar so that said complementary feature travels on and along said inclined surface as said deflection member is selectively moved between a first position of nonengagement wherein said biasing bar is substantially undeflected, and a second position wherein said deflection member is deflected in a first direction for imparting a force on the bottom surface of said deflection member in a direction generally opposite to said first direction so as to press the heat sink against the electronic assembly, thereby thermally coupling the heat sink and the electronic assembly.

* * * * *